United States Patent [19]

Mital et al.

[11] Patent Number: 5,512,921
[45] Date of Patent: Apr. 30, 1996

[54] VISUAL DISPLAY SYSTEM HAVING LOW ENERGY DATA STORAGE SUBSYSTEM WITH DATE COMPRESSION CAPABILITIES, AND METHOD FOR OPERATING SAME

[75] Inventors: Amit Mital; David Voth, both of Redmond, Wash.

[73] Assignee: Microsoft Corporation, Redmond, Wash.

[21] Appl. No.: 263,540

[22] Filed: Jun. 22, 1994

[51] Int. Cl.$^6$ .................................................. G09G 5/36
[52] U.S. Cl. ........................................... 345/202; 345/185
[58] Field of Search .................................... 345/185, 202, 345/203; 364/413.22; 382/56, 232, 233, 245

[56] References Cited

U.S. PATENT DOCUMENTS

| | | | |
|---|---|---|---|
| 4,233,601 | 11/1980 | Hankins et al. | 345/202 |
| 5,081,450 | 1/1992 | Lucas et al. | 345/202 |

FOREIGN PATENT DOCUMENTS

| | | | |
|---|---|---|---|
| 0583102 | 7/1993 | European Pat. Off. | G09G 5/00 |
| PCT/US94/ 04238 | 4/1994 | WIPO | G06K 9/36 |

OTHER PUBLICATIONS

Rhodes, Michael L. et al., "Locally Optimal Run–Length Compression Applied to CT Images", IEEE Trans. on Medical Imaging, vol. MI–4, No. 2, pp. 84–90, Jun. 1985.

Compression/Decompression of Font Patterns, IBM Technical Disclosure Bulletin vol. 28, No. 8, Jan. 1986, pp. 3563 and 3564.

*Primary Examiner*—Jeffery Brier
*Attorney, Agent, or Firm*—Lee & Hayes

[57] ABSTRACT

A visual display system for use in computers includes a frame buffer for holding visual information data in a particular format for ready input to a visual display device. The system also includes a compressed frame buffer for storing the visual information data in a compressed format which can be rapidly decompressed in real-time and used in the visual display device. The data is compressed by a microprocessor during idle times and decompressed by a decompression circuit on the fly. In some circumstances, the power consumed by compressing and then repeatedly handling the compressed data is less than the power used to repeatedly handle the full uncompressed data set. The visual display system analyzes the visual information data and determines whether compression would help save energy. In the event that the handling of compressed data saves energy, the visual display system will use the compressed data set until the information is changed or updated. In this manner, the visual display system reduces power consumption which helps improve battery life in portable computers. A method for operating a visual display system using this energy saving compression technique is also described.

29 Claims, 7 Drawing Sheets

FIG. 3

VISUAL DISPLAY SYSTEM HAVING LOW ENERGY DATA STORAGE SUBSYSTEM WITH DATE COMPRESSION CAPABILITIES, AND METHOD FOR OPERATING SAME

TECHNICAL FIELD

This invention relates to visual display systems, such as LCD systems, used in computers. More particularly, this invention relates to a low energy data storage subsystem having data compression and decompression circuitry to reduce power consumption in visual display systems.

BACKGROUND OF THE INVENTION

Visual display devices are used in computers to provide information in visual form to the user. Commonly known visual display devices include monitors used in personal computers, LCD (liquid crystal display) screens used in portable computers, and flat panel touchscreen displays such as those used in point-of-purchase computers.

This invention is particularly directed to visual display devices used in portable computers, such as laptops, notebooks, and palmtops. These portable computers typically employ LCD screens. One important design consideration for portable computers is power consumption. It is desirable to design portable computers to consume very little power during operation, thereby extending the duration of computer usage between battery charges. Visual display devices represent a significant portion of the power consumption for the entire portable computer. There is a need to design visual display devices with low power consumption.

Conventional visual display devices convert a string of digital data into visual information that can be displayed on the screen. For efficient handling of the data, the data is first organized in a memory according to a preset format representative of the screen layout. The formatted data pattern is then efficiently transferred to the visual display device for immediate display. The data is sent to the screen many times per second to "refresh" the screen. If the visual information displayed on the screen is not changed, the same data is used over and over during screen refresh. This refreshing process consumes power.

SUMMARY OF THE INVENTION

This invention reduces power consumption by providing a visual display system that uses a low energy data storage subsystem. According to one aspect of the invention, the visual information data to be input to the visual display device is compressed in software so that the refreshing process uses a reduced subset of data. The compressed data is later decorepressed in hardware before input to the visual display device. In some circumstance, the process of refreshing the display screens using the compressed data utilizes less energy than transferring the full uncompressed data to the display screen.

In one preferred embodiment, a visual display system of this invention includes a frame buffer for holding visual information data in a particular format for ready input to a visual display device, such as an LCD screen. The system also includes a compressed frame buffer for storing the visual information data in a compressed format which can be rapidly decompressed in real-time and used in the visual display device. The data is compressed by a microprocessor during idle times and decompressed by a decompression circuit in real time. In some circumstances, the power consumed by compressing and then repeatedly handling the compressed data is less than the power used to repeatedly handle the full uncompressed data set. The visual display system analyzes the visual information data and determines whether compression would help save energy. In the event that the handling of compressed data saves energy, the visual display system will use the compressed data set until the information is changed or updated. In this manner, the visual display system reduces power consumption which helps improve battery life in portable computers.

According to another aspect, this invention concerns a method for operating a visual display system using this energy saving compression technique. First, visual information data is stored in a particular format in a frame buffer for input to a visual display device. Then, the visual information data is compressed according to a predefined compression/decompression scheme. This compression can be done with each set of visual information data, but is preferably done occasionally when compression is likely to save energy. The compressed visual information data is stored in a compressed frame buffer for ready input to the visual display device. A choice is then made to use either the uncompressed visual information data stored in the frame buffer or the compressed visual information data stored in the compressed frame buffer. The selected data set is used to repeatedly update the visual display device.

BRIEF DESCRIPTION OF THE DRAWINGS

Preferred embodiments of the invention are described below with reference to the accompanying drawings, which are briefly described below. The same reference numerals are used throughout to reference like components and features.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
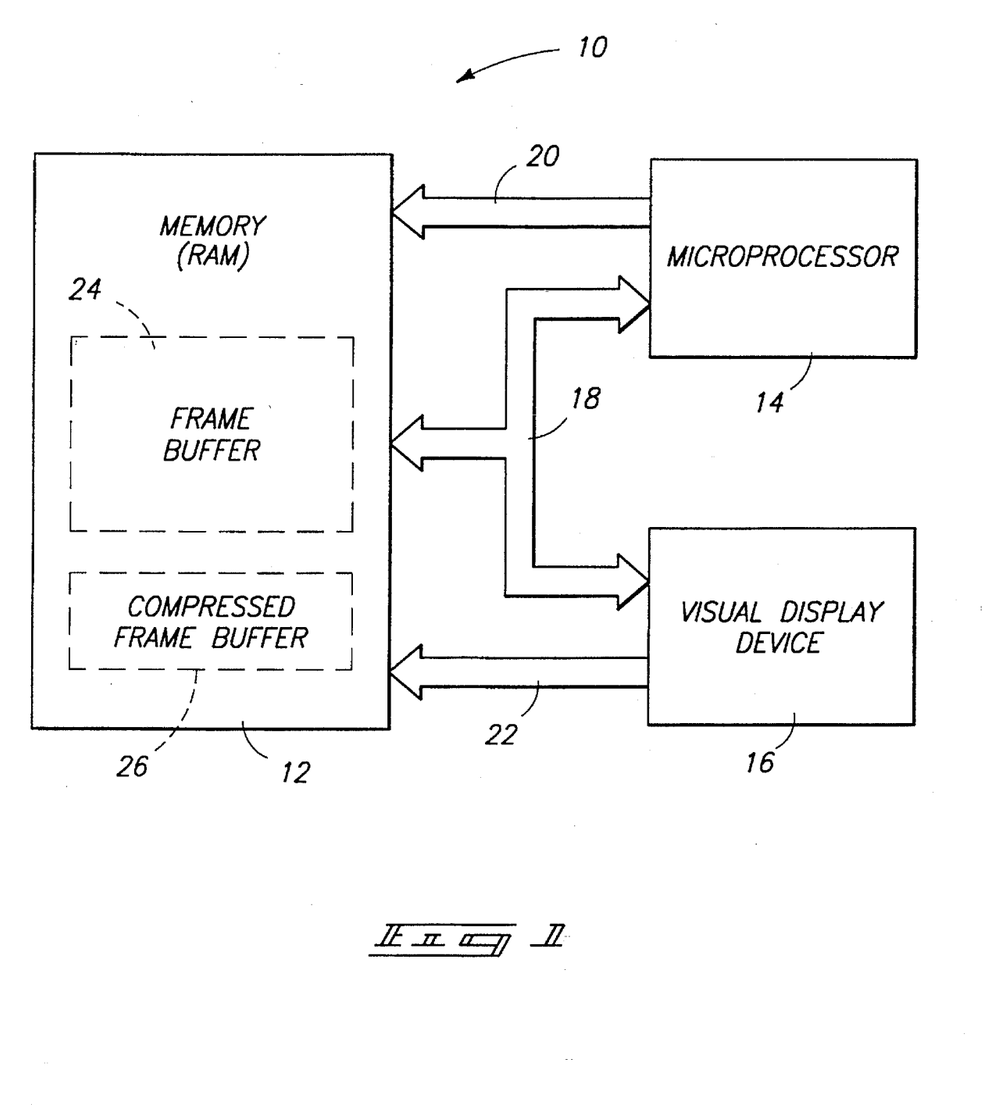
FIG. 1 is a block diagram of a visual display system according to this invention.

FIG. 1 shows a visual display system 10 constructed according to this invention. Visual display system 10 is particularly designed for use in computers, such as personal and portable computers. Visual display system 10 includes a memory 12 which is preferably formed of RAM (Random Access Memory), a microprocessor 14, and a visual display device 16. A data bus 18 interconnects memory 12, microprocessor 14, and visual display device 16. Address buses 20 and 22 supply addresses to memory 12 from microprocessor 14 and visual display device 16, respectively. Two address buses are shown for purposes of explanation, although a single address bus can alternatively be used.

Visual display device 16 includes a screen and associated controller components that converts digital data from memory 12 into visual information used by the screen to depict various images. Examples of visual display device 16 include a tube-type monitor and an LCD device. For purposes of continuing discussion, the visual display device 16 will be described in the context of an LCD device. An example LCD device has a screen with a resolution of 320×240 pixels.

Memory 12 stores data representative of the visual information to be displayed on visual display device 16. This visual information data is transferred over data bus 18 as needed. Memory 12 is preferably partitioned into frame buffer 24 and compressed frame buffer 26. These portions of memory 12 are preferably dynamic in size and can be enlarged or reduced depending upon the data stored therein.

Frame buffer 24 is designed to hold a portion of the visual information data in a particular format that is ready for immediate input into visual display device 16. Ideally, frame buffer 24 contains enough data to fill one entire screen in the visual display device. For example, assume that the LCD screen has a resolution of 320×240 pixels, or 76.8 k pixels, where each pixel is capable of 16 different shades of color. For this example LCD screen, four bits of data (or one-half byte) are used to control each pixel. This requires a total memory capacity for frame buffer 24 of 38.4 k bytes.

The frame buffer is configured in a preset format where bytes are arranged in order to correspond with sequential pixels on the LCD screen. To display the images, the entire data set in frame buffer 24 is serially transferred via data bus 18 to visual display device 16 where the data is decoded and used to control the associated pixels. This data is sent to the screen many times per second (often, hundreds of times per second) to continually refresh the screen display. To change images on the screen, new visual information data is written into frame buffer 24 and then transferred to visual display device 16.

According to this invention, the continual transfer of a full set of data (i.e., 38.4 k bytes) from frame buffer 24 to visual display device 16 requires a certain amount of energy. This energy consumption is an important parameter in the design of portable computers, such as laptops, notebooks, and palmtops, which are typically powered by a battery supply. When the display remains unchanged or idle for extended periods of time, considerable energy is consumed by using the full uncompressed data set simply to constantly refresh the LCD screen.

Accordingly, this invention provides a low energy data storage subsystem which uses compressed data stored in compressed data buffer 26 to reduce the amount of data continually being transferred within the visual display system. The data storage subsystem uses the compressed data during idle times where images are not being updated. The continual handling of the compressed data set consumes less power over the idle duration than the energy required for continually handling the full uncompressed data set during the same time period. The use of compressed data therefore lowers power consumption of the portable computer to thereby help extend the computer battery life.

The visual information data can be compressed according to various compression/decompression schemes. One preferred compression/decompression scheme is run length encoding (RLE) which is discussed below in more detail. The compressed data is held in compressed frame buffer 26 and transferred from this buffer through bus 18 to visual display device 16, where it is decompressed prior to decoding and use.

Figure 2:
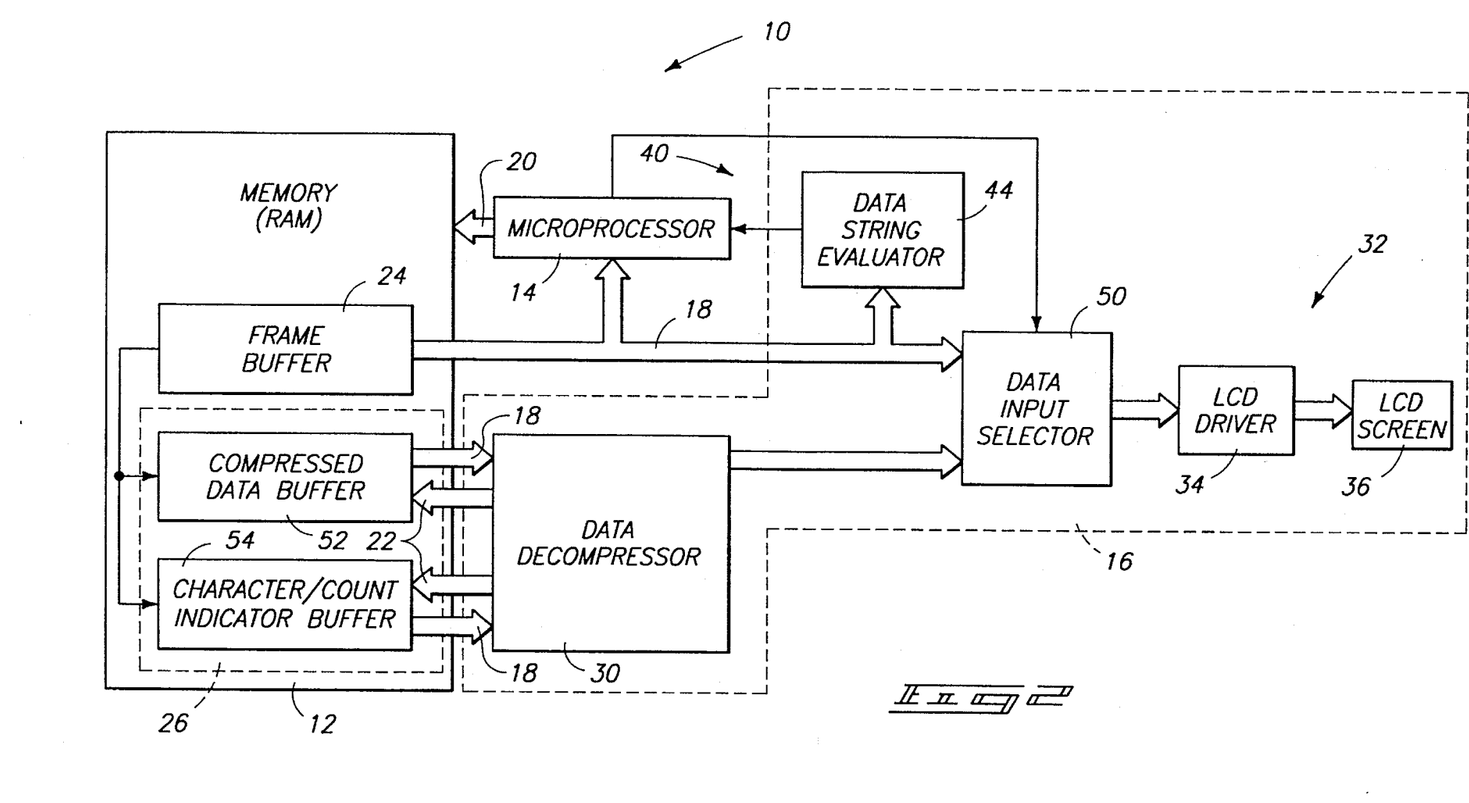
FIG. 2 is a block diagram of one preferred construction of the FIG. 1 visual display system which includes a low energy data storage subsystem that has data compression and decompression capabilities.

FIG. 2 shows a preferred implementation of visual display system 10. A data decompressor 30 is coupled between compressed frame buffer 26 and an LCD device 32. LCD device comprises an LCD driver 34 and an LCD screen 36. Data decompressor 30 decompresses the visual information data held in compressed frame buffer 26 in real-time as the data is serially transferred to LCD device 32. The data is decompressed according to the same compression/decompression scheme used to create the data in compressed frame buffer 26. Preferably, the data decompressor is formed in hardware which efficiently decompresses data without consuming much energy. A preferred circuit construction of data decompressor 30 is described below with reference to FIG. 3. In one implementation, the data decompressor circuit is formed as part of the visual display device 16 as illustrated in FIG. 2.

According to another aspect of this invention, visual display system 10 includes a data compression analyzer 40 which is used to determine whether the visual information data contained in frame buffer 24 is suitable or conducive to compression from a power consumption perspective. The process of compressing data requires energy and may, in some circumstances, actually result in higher power consumption than simply using the full set of data in its uncompressed state. This is particularly true where the images displayed on the LCD screen 36 are complex and constantly changing (i.e., where there is very little idle time). Since an object of the design is to save energy, it would be advantageous to predict before hand whether the data set held in frame buffer 24 is conducive to compression in a manner which would save energy. Compression analyzer 40 provides an obtainable compression ratio for a given data set which represents a measure of the benefit in terms of power reduction, if any, that can be achieved through data compression.

Compression analyzer 40 is connected to frame buffer 24 via bus 18 to monitor the non-compressed stream of visual information data being sent from frame buffer 24 to LCD device 32. Data compression analyzer 40 includes a data string evaluator 44 which generates compression performance information indicative of whether the particular stream of uncompressed visual information data is appropriate for compression from a power saving standpoint. Data string evaluator 44 can be implemented in hardware or software. In the preferred implementation where the compression/decompression scheme is RLE, data string evaluator 44 is implemented in hardware resident on visual display device 16 as is described below in more detail with reference to FIG. 4.

Compression analyzer 40 also includes a portion of the system microprocessor 14 which is programmed to decide whether the visual information data should be compressed based upon the compression performance information generated by data string evaluator 44. If microprocessor 14 determines that compression is appropriate, it initiates data compression of the visual information data held in frame buffer 24. Microprocessor 14 also performs the data compression according to the predefined compression/decompression scheme, such as RLE, to create the data in compressed frame buffer 26. Preferably, the data compression algorithms are implemented in software programmed into microprocessor 14.

In this manner, microprocessor 14 effectively embodies a data compressor, which is responsive to compression analyzer 40, to compress the visual information data. Data compression is preferably performed during idle periods of the microprocessor. Microprocessor 14 sets a flag when the compression is done. The compressed data set is then placed in compressed frame buffer 26 created in RAM 12 for use by LCD device 32.

A data input selector 50 is used to alternately input the uncompressed visual information data held in frame buffer 24 or the compressed visual information data held in compressed frame buffer 26 into LCD device 32. Data input selector 50 makes the selection in response to a determination by data compression analyzer 40 as to whether that particular data set is compressed.

The process of initially compressing the visual information data and then subsequently and repeatedly transferring the compressed data from buffer 26 through data decompressor 30 to refresh LCD screen 34 consumes a finite amount of energy. According to the design of this invention, compression analyzer 40 pre-examines the uncompressed data set to determine a compression ratio for that data set. This compression ratio is then used as an indication of whether data compression would result in any eventual savings in energy by using the compressed data as opposed to uncompressed data. Hopefully, over the duration of idle inactivity, the amount of energy required to handle compressed data from compressed frame buffer 26 for screen refresh is less than the amount of energy required to handle full uncompressed data directly from frame buffer 24.

The use of compressed data would conserve energy in cases where the images being depicted on the LCD screen are relatively simple (i.e., yielding a relatively high ratio of data compression) and not constantly changing (i.e., long periods of idle time). The data storage subsystem works closely with the operating system in charge of sending the visual information data to the data storage subsystem to determine whether any image changes are scheduled. If no image changes are scheduled, the LCD screen will continue to be refreshed with the same image. In such cases, working with the reduced set of data held in compressed frame buffer 26 would result in lower power consumption. The data input selector 50 alternatively inputs data from the frame buffer or from the compressed frame buffer depending upon whether the data has been previously compressed.

In the most preferred embodiment, the visual information data is compressed according to a compression/decompression scheme of run length encoding (RLE). In RLE, the visual information data is compressed by reducing a repeating character sequence within the data to a single character plus a count of the number of times the character is repeated.

Figure 5:
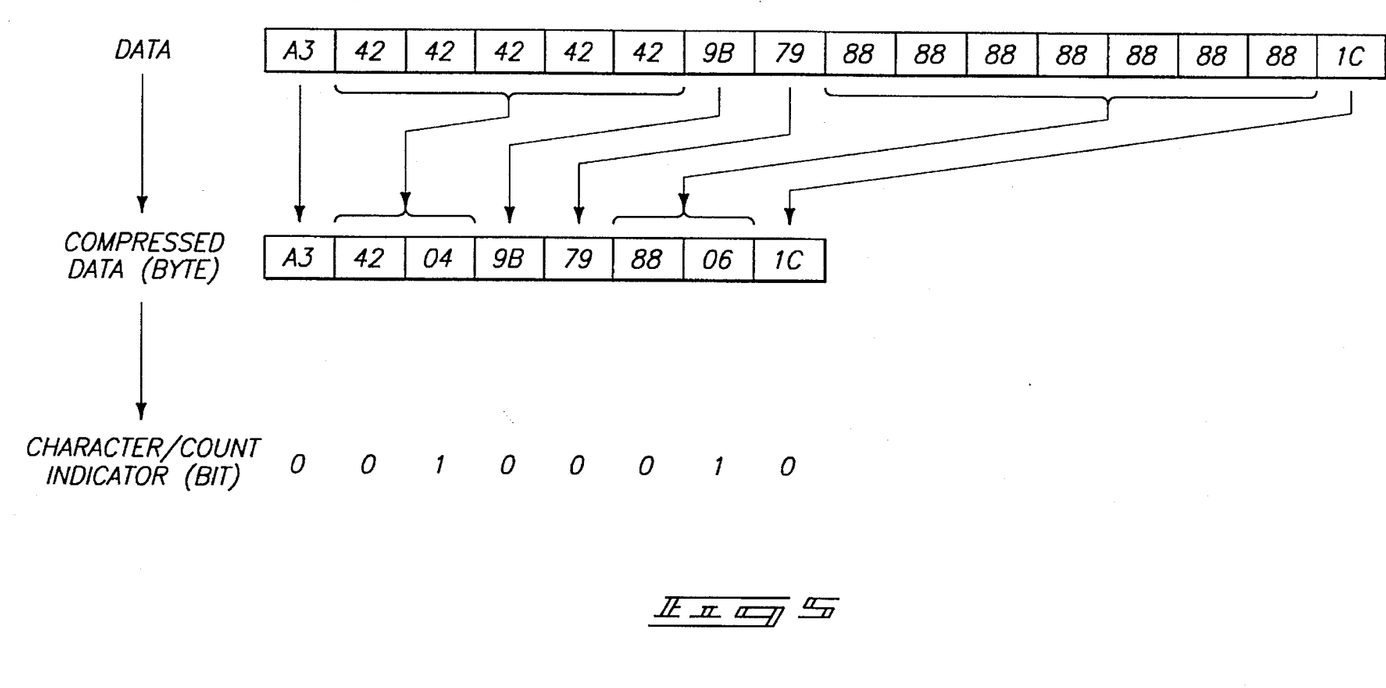
FIG. 5 illustrates compression of visual information data according to run length encoding (RLE) techniques. The visual information data is compressed into a byte string of compressed data consisting of characters and counts and an associated bit string of character/count indicators which identify whether the corresponding compressed data byte represents a character or a count.

FIG. 5 illustrates the RLE compression where a string of uncompressed data (top series of blocks) is compressed. Each block represents one byte of data, with the data being represented in hexadecimal notation. According to RLE compression, a repeating character string is reduced to its common root number, followed by a count of the number of times it is repeated. In this example, characters "42" and "88" are repeated a number of times. This redundant string of characters is compressed as shown in the second line of FIG. 5 where the character "42" is followed by a count of the number of additional times the character "42" is repeated. In this case, the character "42" is repeated four times. Similarly, the character "88" is repeated an additional six times.

RLE compression is well known. Typically, the compression of a repeating character sequence yields three bytes: a special character byte indicating that compression follows, a second byte representing the repeated character, and a third byte representing the character count for that repeated character. According to this invention, however, a repeating character sequence is separated into two separate strings: (1) a byte string of compressed data consisting of characters and counts, and (2) a bit string of character/count indicators that identify whether the associated compressed data is a character or count.

As shown in FIG. 5, a character/count indicator bit having one binary value, such as "0", indicates that the corresponding byte in the compressed data string represents a character in the visual information data. Conversely, a binary "1" bit indicates that the corresponding byte in the compressed data string represents a count. In this case, the corresponding bytes "04" and "06" represent counts of the preceding data characters "42" and "88", respectively.

The data compressor embodied in microprocessor 14 performs the data compression according to RLE techniques to produce the byte string of compressed data and the bit string of character/count indicators. As illustrated in FIG. 2, compressed frame buffer 26 includes a compressed data buffer 52 for storing the byte string of compressed data and a character/count indicator buffer 54 for storing the bit string of character/count indicators. The advantage of using two separate buffers to handle the RLE compressed data is that it simplifies the hardware circuit design for data decompressor 30. This aspect is shown in more detail in FIG. 3.

Figure 3:
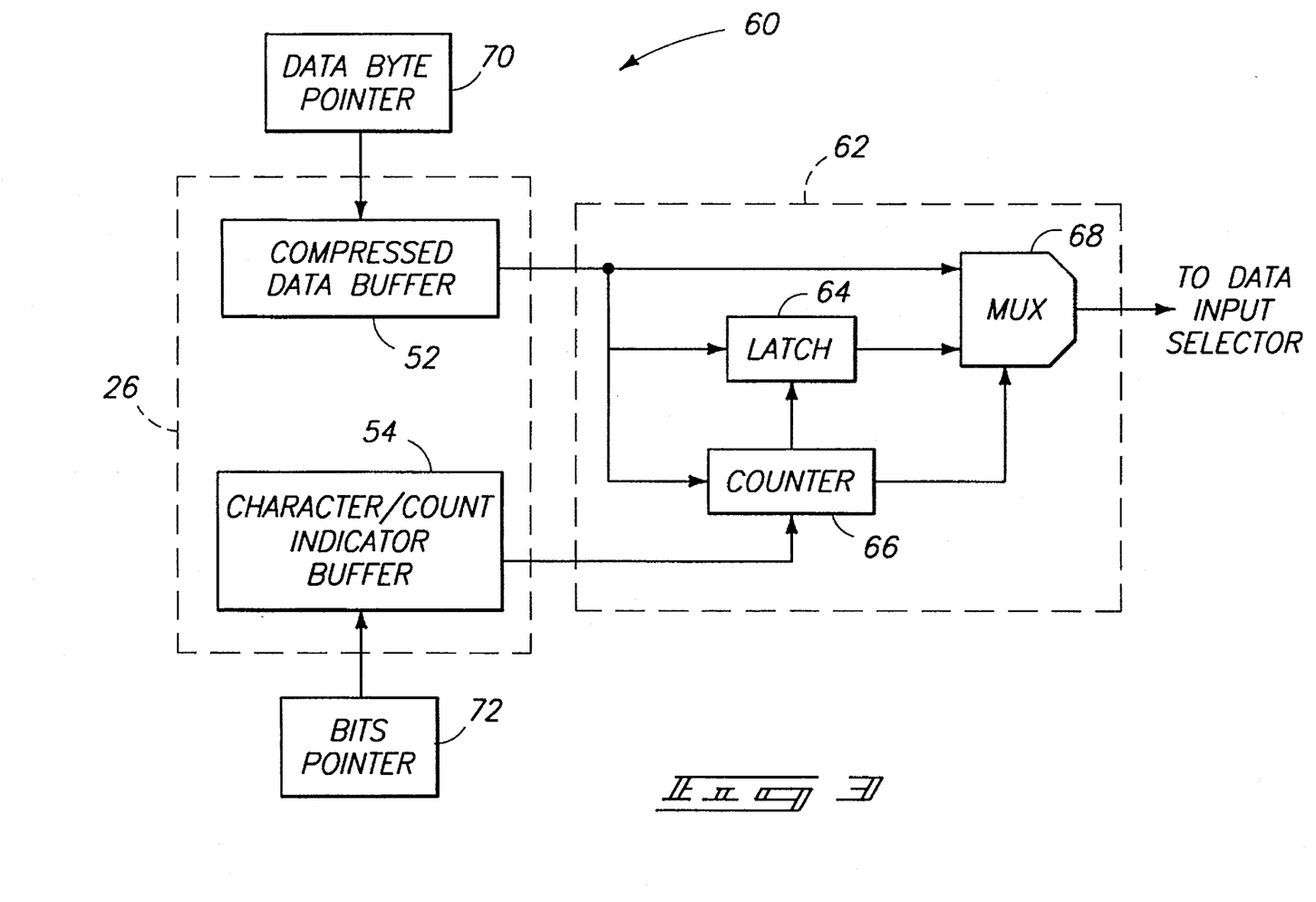
FIG. 3 is a block diagram of a data decompression circuit used in the FIG. 2 visual display system.

FIG. 3 illustrates a data decompression circuit 60 for decompressing visual information data that has been previously compressed using RLE techniques. Data decompression circuit 60 includes compressed data buffer 52 for storing the compressed data string, character/count indicator buffer 54 for storing the bit string of character/count indicators, and an RLE decoding circuit 62 which is coupled to buffers 52 and 54. RLE decoding circuit 62 converts the byte string of compressed data into uncompressed visual information data by repeating characters in the byte string of compressed data according to the counts associated with the characters. RLE decoding circuit 62 selectively identifies the characters and counts within the compressed data during conversion in accordance with the character/count indicators from buffer 54.

RLE decoding circuit 62 includes a latch 64, a counter 66, and a multiplexor 68. Latch 64 is connected to compressed data buffer 52 to temporarily hold a character from the byte string of compressed data. Counter 66 is also coupled to compressed data buffer 52. For those data characters having an associated count, the count is input into counter 66 to initialize the counter to a starting value for counting the number of times the character held in latch 64 is to be repeated. The data entered into counter 66 from compressed data buffer 52 is identified as a count based upon the associated character/count indicator bit input to counter 66 from character/count indicator buffer 54.

Multiplexor 68 selectively chooses between characters received directly from compressed data buffer 52 or the decompressed repeating character sequence received from latch 64 to effectively reconstruct the visual information data to be sent to the data input selector. Multiplexor 68 makes this selection based upon a signal from counter 66. Where the character in latch 64 is still being repeated, counter 66 instructs multiplexor 68 to select data from latch 64. On the other hand, where the character in latch 64 no longer needs repeating or is a character that has never been compressed in the first place, counter 66 commands multiplexor 68 to select data directly from compressed data buffer 52. Although a multiplexor is described, other types of switches for alternately selecting between multiple inputs may be used in RLE decoding circuit 62.

The operation of RLE decoding circuit 62 will now be described with reference to the example set forth in FIG. 5. Here, RLE decoding circuit 62 will decompress the compressed data string (middle row in FIG. 5) to reconstruct the uncompressed data string (top row in FIG. 5). The first data "A3" is output from compressed data buffer 52 into multiplexor 68, latch 64, and counter 66. Because the associated character/count indicator bit is a binary "0", the counter understands that the compressed data byte represents a character. Multiplexor 68 is therefore instructed to select the character "A3" directly from the compressed data buffer 52 and pass this character to the data input selector.

The next data is "42" which is also indicated as being a character, and thus is output to the data input selector. The third byte of data "04" represents a count as indicated by the character/count indicator bit being a binary "1". Accordingly, counter 66 recognizes that this piece of data is a count, and operably controls latch 64 to output the previous data character "42" the represented number of times of the count stored in counter 66 (i.e., "42" is repeated four additional times). Concurrently, counter 66 signals multiplexor 68 to select the data coming from latch 64 to thereby reconstruct the repeated data string.

Counter 66 can be preliminarily informed as to whether the next data piece from compressed data buffer 52 is a character or count based upon addressing protocol handled by data pointer 70 and bits pointer 72. Data pointer 70 sequentially steps through the compressed data in buffer 52, and bits pointer 72 indexes the bits associated with the bytes in compressed data buffer 52. According to one technique, bits pointer 72 can access the bit for the next associated data byte to be output from buffer 52 in a preliminarily fashion to inform RLE decoding circuit 62 as to whether that next data byte is a character or count. Data pointer 70 and bits pointer 72 can be operatively controlled through feedback from RLE decoding circuit 62, or alternatively by microprocessor 14.

Figure 6:
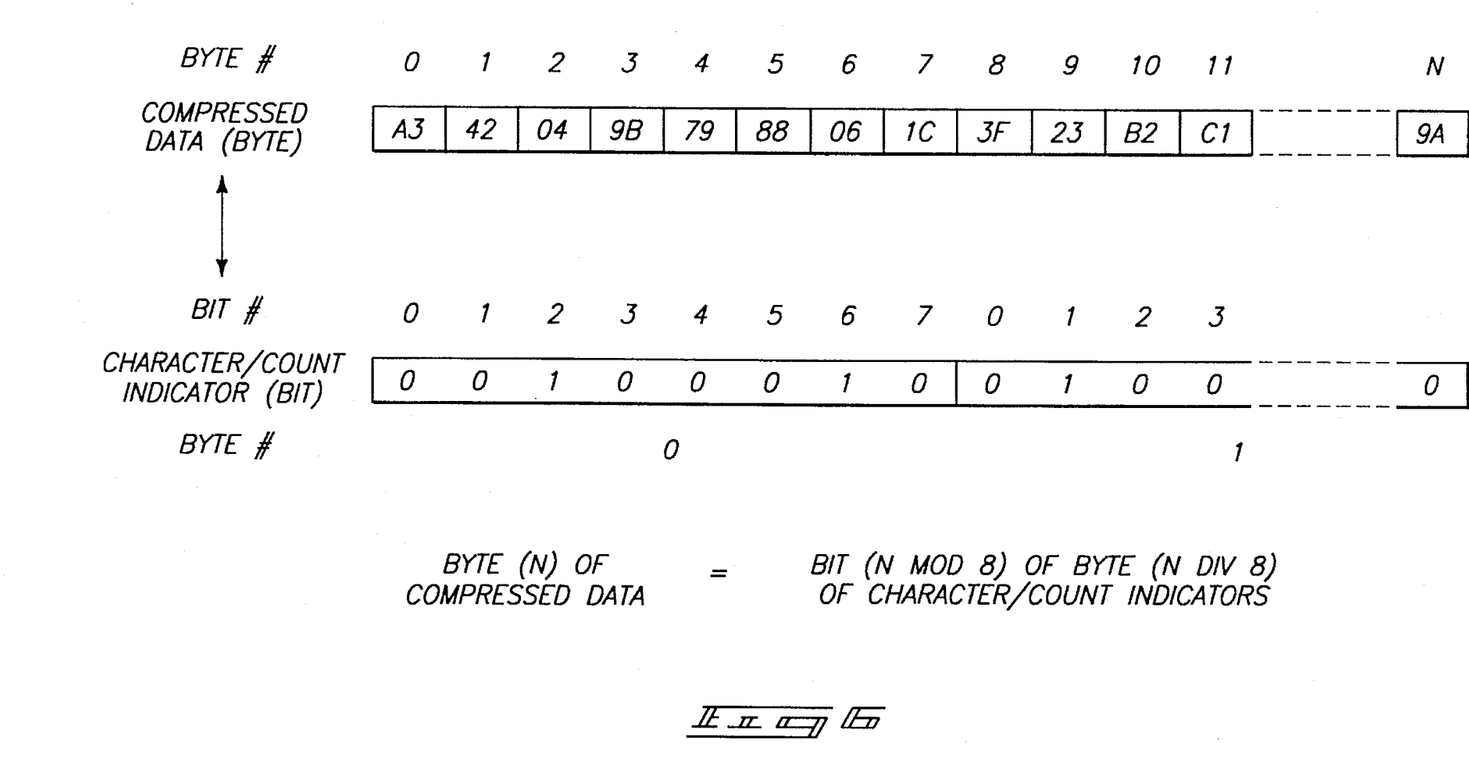
FIG. 6 illustrates the relationship between the bytes of compressed data and the bits of the character/count indicators.

FIG. 6 further illustrates the relationship between the bytes of compressed data held in buffer 52 and the bit string of character/count indicators held in buffer 54. The illustrated byte string of compressed data is identical to that shown in FIG. 5, but extended to include additional data. Each rectangular block in FIG. 6 represents one byte (i.e., 8 bits) of information. Each character/count bit is associated with one byte of compressed data. An entire byte of character/count bits therefore represents eight bytes of compressed data. For example, bit 5 in byte 0 of the character/count indicator bit string is associated with byte No. 5 in the compressed data string. A relationship between the compressed data and indicator bits can be defined as follows:

$$\text{byte } (N) \text{ of compressed data} = \text{bit } (N \text{ MOD } 8) \text{ of byte } (N \text{ DIV } 8) \text{ of character/count indicators.}$$

The notation "N DIV 8" means the whole integer division of the Nth value by the number 8. The notation "N MOD 8" represents the modulo arithmetic operation which yields the remainder obtained by dividing the number N by 8. Consider, for example, the 11th byte in the compressed data string (i.e., N=11). The character/count indicator bit associated with this byte is the third bit (i.e., 11 MOD 8=3) in byte No. 1 (i.e., 11 DIV 8=1) of the character/count indicator bit string. According to this relationship, access to associated data and character/count indicator bits in respective buffers 52 and 54 can easily be controlled.

As noted above, it is preferable that frame buffer 24, compressed data buffer 52, and character/count indicator buffer 54 be formed in RAM 12. Such physical memory space is advantageous from a low power consumption standpoint. Alternatively, separate buffer components can be used.

Figure 4:
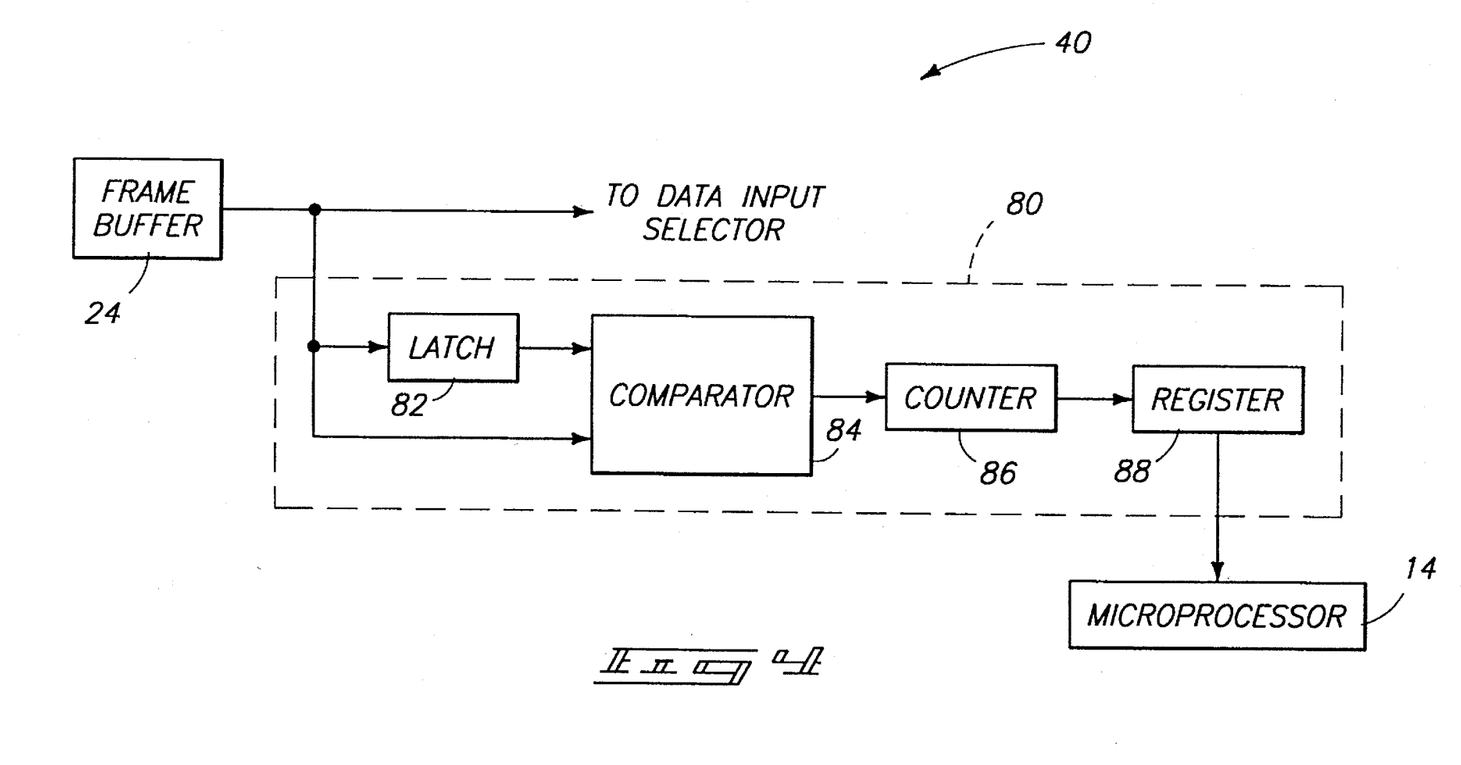
FIG. 4 is a block diagram of a data compression analyzer used in the FIG. 2 visual display system.

FIG. 4 shows a preferred construction of a data compression analyzer 40 which is tailored to analyze data for possible compression using RLE techniques. Compression analyzer 40 comprises a consecutive match counting circuit 80 which is operatively coupled to monitor visual information data held in frame buffer 24 as the data is transferred to the LCD device. Consecutive match counting circuit 80 derives a compression ratio by counting the number of times characters in the visual information data are repeated. This count is then later used by microprocessor 14 to determine whether the visual information data should be compressed via RLE in an effort to conserve energy. For instance, if the visual information data contains a large number of repeated characters (which is a situation when the images contain many blank spaces), consecutive match counting circuit 80 will return a fairly high count.

Microprocessor 14 is programmed with a threshold value which indicates a breakeven point where handling a compressed data set consumes approximately the same energy as handling the full uncompressed data set. If the count exceeds this threshold value, the microprocessor 14 will initiate and carry out the data compression to place a reduced compressed data set into compressed frame buffer 26.

Consecutive match counting circuit 80 includes a latch 82, a comparator 84, a counter 86, and a register 88. Comparator 84 compares sequential characters in the visual information data by comparing a previously output data character held in latch 82 with the next subsequently output data character input directly from frame buffer 24. If the two characters are identical, comparator 84 outputs a match signal to increment counter 86. In this manner, counter 86 effectively tallies the number of matches between sequential characters in the visual information data and outputs this total into register 88. Microprocessor 14 can then examine the total count value in register 88 to determine whether it exceeds the threshold value and thus indicates that the data should be compressed for power saving purposes. Register 88 may be a separate register in hardware, or a space reserved in RAM 12.

According to this design, consecutive match counting circuit 80 effectively predicts whether the visual information data held in frame buffer 24 is conducive to compression under RLE. If it is, microprocessor 14 compresses the data and places it in compressed frame buffer 26 (i.e., compressed data buffer 52 and character/count indicator buffer 54). Then, the compressed data can be used to refresh the information displayed on the screen in a more efficient and energy preserving manner. For more simple images, the reduced data set significantly lowers power consumption to thereby help extend the battery life of a portable computer.

Figure 7:
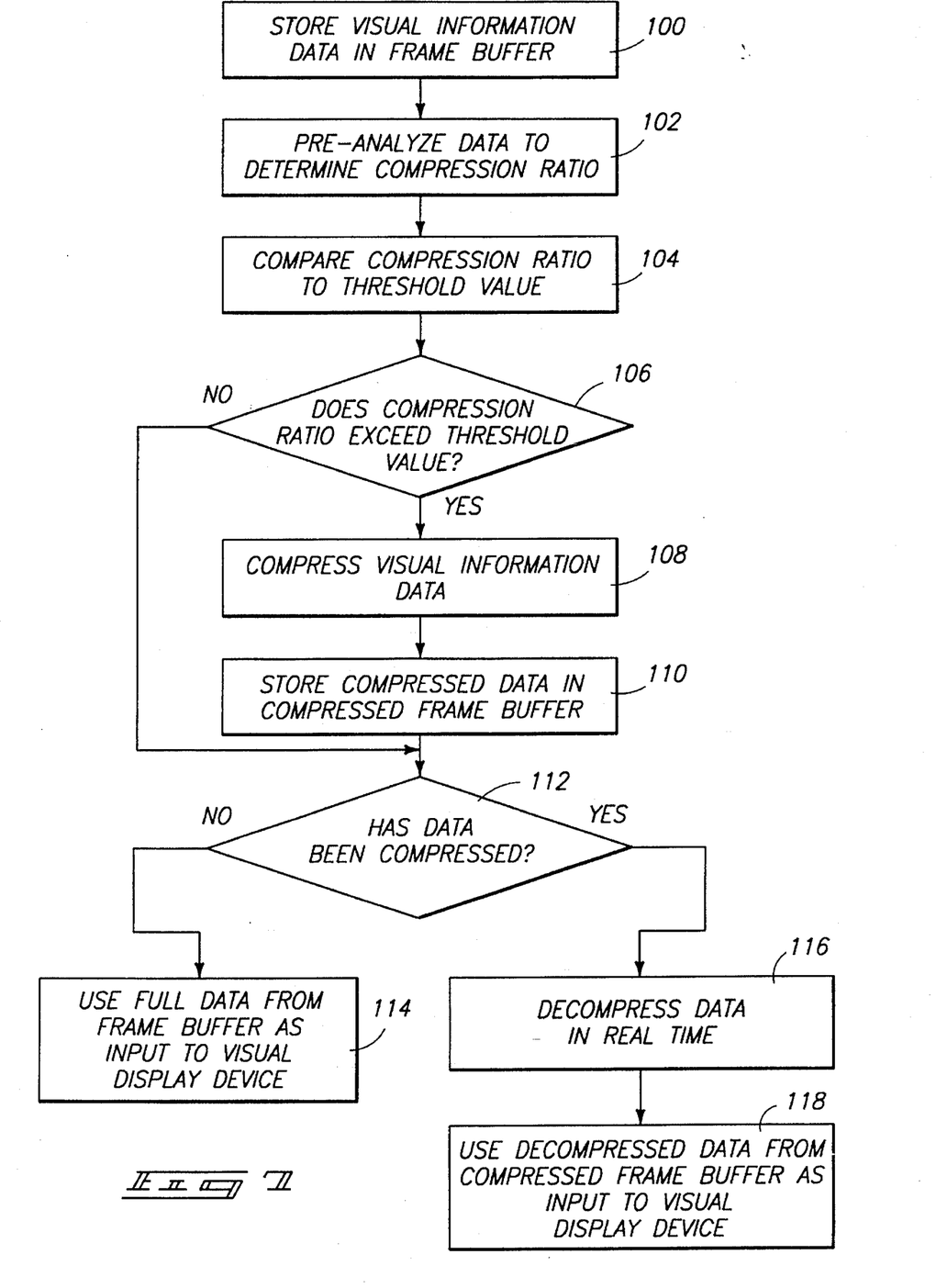
FIG. 7 is a flow diagram of a method for operating a data storage subsystem for a visual display device according to this invention.

A method for operating a data storage subsystem for a visual display device used in computers will now be described with reference to the flow diagram in FIG. 7, and the block diagrams of FIGS. 1–2.

At step 100, visual information data is stored in a particular format in frame buffer 24 for input to visual display device 16. The visual information data is then pre-analyzed to determine whether it should be compressed (step 102). This is done in the preferred implementation by compression analyzer 40 which monitors the visual information data as it is sent via data bus 18 to data input selector 50. Compression analyzer 40 returns a compression ratio for the particular visual information data. The compression ratio can then be compared to a threshold value (step 104). If the compression ratio exceeds the threshold value, the visual information data is compressed; otherwise the data set remains in its uncompressed state (step 106). In this manner, the step of compressing the visual information data is conditioned upon whether the compression ratio exceeds the preset threshold value. The visual information data is therefore compressed on some occasions and left uncompressed on other occasions.

At step 108, the visual information data is compressed according to a predefined compression/decompression scheme, such as RLE techniques. The compressed visual information data is stored in compressed frame buffer 26 for ready input to visual display device 16 (step 110). It is then determined at step 112 whether to use the visual information data stored in the frame buffer or the compressed visual information data stored in the compressed frame buffer to repeatedly update the visual display device. This decision preferably turns on whether the data has been previously compressed. That is, the full uncompressed visual information data stored in the frame buffer is selected by data input selector 50 in the event the visual information data has not been compressed. The uncompressed data set is then input to LCD driver 34 (step 114).

Conversely, data input selector 50 selects at step 112 the compressed visual information data stored in the compressed frame buffer in the event the visual information data has been compressed. The data is decompressed by data decompressor 30 in real-time according to the predefined compression/decompression scheme as the compressed data is being transferred to the visual display device (step 116). Data input selector 50 then passes the now decompressed visual information data onto LCD driver 34 (step 118).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method for operating a data storage subsystem for a visual display device used in computers, the method comprising the following steps:

storing visual information data in a particular format in a frame buffer for input to a visual display device;

compressing the visual information data according to a predefined compression/decompression scheme on some occasions, while leaving the visual information data uncompressed on other occasions;

storing the compressed visual information data in a compressed frame buffer for input to the visual display device; and selectively using the visual information data stored in the frame buffer in the event the visual information data is not compressed and using the compressed visual information data stored in the compressed frame buffer in the event the visual information data is compressed to repeatedly update the visual display device.

2. A method according to claim 1, comprising the additional step of decompressing the compressed visual information data in real-time according to the predefined compression/decompression scheme as the compressed visual information is being transferred to the visual display device.

3. A method for operating a data storage subsystem for a visual display device used in computers, the method comprising the following steps:

storing visual information data in a particular format in a frame buffer for input to a visual display device;

pre-analyzing the visual information stored in the frame buffer to determine whether the visual information data should be compressed;

compressing the visual information data in the event that it should be compressed;

storing the compressed visual information data in a compressed frame buffer for input to the visual display device; and selectively using the visual information data stored in the frame buffer or the compressed visual information data stored in the compressed frame buffer to repeatedly update the visual display device.

4. A method according to claim 3, comprising the following additional steps:

pre-analyzing the visual information data stored in the frame buffer to determine a compression ratio for the visual information data;

comparing the compression ratio to a preset threshold value, the threshold value indicating that using the compressed visual information data would consume less energy than using the full uncompressed visual information data; and wherein the step of compression the visual information data is conditioned upon whether the compression ratio exceeds the preset threshold value.

5. A low energy data storage subsystem for a visual display device used in computers, the data storage subsystem comprising:

a frame buffer to hold visual information data in a particular format for input to the visual display device;

a data compressor to compress the visual information data according to a predefined compression/decompression scheme on some occasions, while leaving the visual information data uncompressed other occasions;

a compressed frame buffer to store the compressed visual information data from the data compressor for use by the visual display device;

a data decompressor coupled to the compressed frame buffer to decompress the compressed visual information data in real-time according to the predefined compression/decompression scheme as the compressed visual information is being transferred to the visual display device; and a data input selector to alternatively select for input to a visual display device (1) the uncompressed visual information data from the frame buffer in the event the visual information data is not compressed or (2) the decompressed visual information data from the data decompressor in the event the visual information data is compressed.

6. A low energy data storage subsystem for a visual display device according to claim 5, wherein the data compressor comprises a microprocessor programmed to compress data according to the compression/decompression scheme.

7. A low energy data storage subsystem for a visual display device according to claim 5, wherein:

the data compressor comprises a microprocessor programmed to compress data according to the compression/decompression scheme; and the data decompressor comprises a decoding circuit.

8. A low energy data storage subsystem for a visual display device used in computers; the data storage subsystem comprising:

a frame buffer to hold visual information data in a particular format for input to the visual display device;

a data compressor to compress the visual information data according to run length encoding (RLE);

a compressed frame buffer to store the compressed visual information data from the data compressor for use by the visual display device;

a data decompressor coupled to the compressed frame buffer to decompress the compressed visual information data in real-time according to the RLE encoding as the compressed visual information is being transferred to the visual display device; and a data input selector to alternatively select for input to a visual display device (1) the uncompressed visual information data from the frame buffer or (2) the decompressed visual information data from the data decompressor.

9. A low energy data storage subsystem for a visual display device according to claim 5 wherein:

the compression/decompression scheme is run length encoding (RLE) where the visual information data is compressed by reducing a repeating character sequence within the data to a single character plus a count of the number of times the character is repeated;

the data compressor converts an uncompressed data string into (1) a byte string of compressed data consisting of characters and counts and (2) a bit string of character/count indicators that identify whether the compressed data is a character or a count; and the compressed frame buffer comprises:

a compressed data buffer to store the byte string of compressed data; and a character/count indicator buffer to store the bit string of character/count indicators.

10. A low energy storage subsystem for a visual display device according to claim 9, wherein the frame buffer, the compressed data buffer, and the character/count indicator buffer are formed in RAM.

11. A low energy storage subsystem for a visual display device according to claim 5, wherein:

the compression/decompression scheme is run length encoding (RLE) where the visual information data is compressed by reducing a repeating character sequence within the data to a single character plus a count of the number of times the character is repeated;

the data compressor comprises a microprocessor programmed to convert an uncompressed data string into (1) a byte string of compressed data consisting of characters and counts and (2) a bit string of character/count indicators that identify whether the compressed data is a character or a count;

the compressed frame buffer comprises:

(a) a compressed data buffer to store the byte string of compressed data; and (b) a character/count indicator buffer to store the bit string of character/count indicators; and the data decompressor comprises an RLE decoding circuit coup to the compressed data buffer and the character/count indicator buffer, the RLE decoding circuit converting the byte string of compressed data into uncompressed visual information data by repeating a character in the byte string of compressed data according to the count associated with that character, the RLE decoding circuit selectively identifying characters and counts within the compressed data during conversion in accordance with the character/count indicators from the character/count buffer.

12. A visual display system for use in computers, the visual display system comprising:

a visual display device to depict images in accordance with visual information data that is input thereto;

a frame buffer to hold the visual information data in a particular format for input to the visual display device;

a compression analyzer coupled to the frame buffer to determine whether the visual information data held in the frame buffer should be compressed;

a data compressor, responsive to the compression analyzer, to compress the visual information data according to the predefined compression/decompression scheme in the event that the compression analyzer determines that the visual information data should be compressed;

a compressed frame buffer to store the compressed visual information data from the data compressor for use by the visual display device;

a data compressor coupled between the compressed frame buffer and the visual display device to decompress the compressed visual information data in real-time according to the predefined compression/decompression scheme as the compressed visual information is being transferred to the visual display device; and a data input selector, responsive to the compression analyzer, to alternately input to the visual display device (1) the visual information data from the frame buffer in the event the analyzer determines that the visual information data should not be compressed or (2) the decompressed visual information data from the data decompressor.

13. A visual display system according to claim 12, wherein the data compressor comprises a microprocessor programmed to compress data according to the compression/decompression scheme.

14. A visual display system according to claim 12, wherein the frame buffer and compressed frame buffer are formed in RAM.

15. A visual display system according to claim 12, wherein the compression analyzer comprises:

a data string evaluator coupled between the frame buffer and the visual display device to analyze the uncompressed visual information data output from the frame buffer, the data string evaluator generating compression performance information indicative of whether the particular visual information data held in the frame buffer is conductive to compression under the predefined compression/decompression scheme; and a microprocessor coupled to receive the compression performance information from the data string evaluator, the microprocessor being programmed to decide whether to compress the visual information data based upon the compression performance information generated by the data string evaluator.

16. A visual display system according to claim 12 wherein:

the compression/decompression scheme is run length encoding (RLE) where the visual information data is compressed by reducing a repeating character sequence within the data to a single character plus a count of the number of times the character is repeated;

the data compressor converts an uncompressed data string into (1) a byte string of compressed data string consisting of characters and counts and (2) a bit string of character/count indicators that identify whether the compressed data is a character or a count; and the compressed frame buffer comprises:
a compressed data buffer to store the byte string of compressed data; and
a character/count indicator buffer to store the bit string of character/count indicators.

17. A visual display system according to claim 12 wherein:

the compression/decompression scheme is run length encoding (RLE) where visual information data is compressed by reducing a repeating character sequence within the data to a single character plus a count of the number of times the character is repeated; and the compression analyzer comprises:
a consecutive match counting circuit coupled between the frame buffer and the visual display device to count the number of times characters in the visual information data are repeated; and
a microprocessor coupled to receive the count from the consecutive match counting circuit, the microprocessor being programmed to initiate RLE compression when the count reaches a selected threshold value.

18. A visual display system according to claim 12 wherein:

the compression/decompression scheme is run length encoding (RLE) where visual information data is compressed by reducing a repeating character sequence within the data to a single character plus a count of the number of times the character is repeated; and the data decompressor comprises and RLE decoding circuit which reconstructs the visual information data in uncompressed form by repeating a character in the compressed visual information data according to the count associated with that character.

19. A data decompression circuit for decompressing visual information data used in a visual display system for computers, the visual information data comprising a string of characters and being compressed according to run length encoding (RLE) where a repeating character sequence is reduced to a single character plus an associated count of the number of times the character is repeated; the data decompression circuit comprising:

a compressed data buffer to store a byte string of compressed data consisting of characters and counts;

a character/count indicator buffer to store a bit string of character/count indicators, the character/count indicators being used to identify whether the compressed data held in the compressed data buffer is a character or a count; Nd an RLE decoding circuit coupled to the compressed data buffer and the character/count indicator buffer, the RLE decoding circuit converting the byte string of compressed data into uncompressed visual information data by repeating a character in the byte string of compressed data according to the count associated with that character, the RLE decoding circuit selectively identifying characters and counts within the compressed data during conversion in accordance with the character/count indicators from the character/count buffer.

20. A data decompression circuit according to claim 19 wherein the bits contained in the character/count indicator buffer correspond to respective bytes held in the compressed data buffer, a bit having one binary value indicating that the corresponding byte represents a character in the visual information data and a bit having the other binary value indicating that the corresponding byte represents a count.

21. A data decompression circuit according to claim 20 wherein the bits contained in the character/count indicator buffer correspond to respective bytes held in the compressed data buffer according to the following relationship:

$$\text{byte } (N) \text{ of compressed data} = \text{bit } (N \text{ MOD } 8) \text{ of byte } (N \text{ DIV } 8) \text{ of character/count indicators.}$$

22. A data decompression circuit according to claim 19 wherein the compressed data buffer and the character/count indicator buffer are formed in RAM.

23. A data decompression circuit according to claim 19 wherein the RLE decoding circuit comprises:

a latch connected to the compressed data buffer for holding a character from the byte string of compressed data;

a counter coupled to the compressed data buffer to receive the count associated with the character held in the latch, the counter receiving the count in response to a character/count indicator from the character/count indicator buffer identifying the compressed data as a count, the counter controlling the latch to repeatedly output the character the number of times equal to the count; and a switch connected to the latch and the compressed data buffer, the switch selectively and alternately outputting decompressed repeating character sequences received from the latch or characters received from the compressed data buffer to reconstruct the visual information data.

24. A data compression analyzer for evaluating visual information data used in a visual display system for computers to determine whether the visual information data is conductive to compression; the visual information data comprising a string of characters held in a frame buffer which, where appropriate, can be compressed according to run length encoding (RLE) where a repeating character sequence is reduced to a single character plus an associated count of the number of times the character is repeated; the data compression analyzer comprising:

a consecutive match counting circuit to count the number of times characters in the visual information data held in the frame buffer are repeated; and a microprocessor coupled to receive the count from the consecutive match counting circuit, the microprocessor being programmed to initiate RLE compression when the count reaches a selected threshold value.

25. A data compression analyzer according to claim 24 wherein the consecutive match counting circuit comprises:

a comparator for comparing sequential characters in the visual information data and outputting a match signal when sequential characters are identical; and a counter coupled to receive the match signal from the comparator, the counter tallying the number of matches between sequential characters in the visual information data.

26. A data input circuit for a visual display device used in computers, the visual display device depicting images according to visual information data that is input thereto; the visual information data comprising a string of characters which can be compressed according to run length encoding (RLE) where a repeating character sequence is reduced to a single character plus an associated count of the number of times the character is repeated; the data input circuit comprising:

a frame buffer to hold the visual information data in a particular format for input to the visual display device;

a consecutive match counting circuit coupled to the frame buffer to count the number of times characters in the visual information data are repeated, the count being used to determine whether the visual information data should be compressed via RLE;

a compressed data buffer to store a byte string of compressed data consisting of characters and counts in the event that the visual information data is compressed;

a character/count indicator buffer to store a string of character/count indicators associated with the compressed data, the character/count indicators being used to identify whether the compressed data held in the compressed data buffer is a character or a count;

an RLE decoding circuit coupled to the compressed data buffer and the character/count indicator buffer, the RLE decoding circuit converting the byte string of compressed data into compressed visual information data by repeating a character in the byte string of compressed data according to the count associated with that character, the RLE decoding circuit selectively identifying characters and counts within the byte string of compressed data during conversion in accordance with the character/count indicators from the character/count buffer; and a data input selector coupled to the frame buffer and the RLE decoding circuit to alternately select for input to the visual display device (1) the visual information data from the frame buffer in the event the data has not been compressed or (2) the compressed visual information data from the RLE decoding circuit in the event the data has not been compressed.

27. A data input circuit for a visual device according to claim 26, wherein the frame buffer, the compressed data buffer, and the character/count indicator buffer are formed in RAM.

28. A data input circuit for a visual display device according to claim 26, wherein the consecutive match counting circuit comprises:

a comparator for comparing sequential characters in the visual information data and outputting a match signal when sequential characters are identical; and a counter coupled to receive the match signal from the comparator, the counter tallying the number of matches between sequential characters in the visual information data.

29. A data input circuit for a visual display device according to claim 26 wherein the RLE decoding circuit comprises:

a latch connected to the compressed data buffer for holding a character from the byte string of compressed data;

a counter coupled to the compressed data buffer to receive the count associated with the character held in the latch, the counter receiving the count in response to a character/count indicator from the character/count indicator buffer identifying the compressed data as a count, the counter controlling the latch to repeatedly output the character the number of times equal to the count; and a switch connected to the latch and the compressed data buffer, the switch selectively and alternately outputting decompressed repeating character sequences received from the latch or characters received from the compressed data buffer to reconstruct the visual information data.

\* \* \* \* \*